US008482030B2

(12) United States Patent
Aono et al.

(10) Patent No.: US 8,482,030 B2
(45) Date of Patent: Jul. 9, 2013

(54) INSULATED GATE BIPOLAR TRANSISTOR AND MANUFACTURING METHOD THEREOF

(75) Inventors: Shinji Aono, Tokyo (JP); Tadaharu Minato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 79 days.

(21) Appl. No.: 13/226,995

(22) Filed: Sep. 7, 2011

(65) Prior Publication Data

US 2012/0153348 A1 Jun. 21, 2012

(30) Foreign Application Priority Data

Dec. 16, 2010 (JP) ................................ 2010-280112
Mar. 23, 2011 (JP) ................................ 2011-063564

(51) Int. Cl.
*H01L 29/739* (2006.01)
*H01L 21/331* (2006.01)

(52) U.S. Cl.
USPC ............. 257/139; 257/E29.197; 257/E21.382

(58) Field of Classification Search
USPC ........................... 257/139, E29.197, E21.382
See application file for complete search history.

(56) References Cited

U.S. PATENT DOCUMENTS 7,750,365 B2 7/2010 Takahashi et al.
2005/0017290 A1 1/2005 Takahashi et al.
2006/0284248 A1 12/2006 Saito et al.
2006/0292805 A1* 12/2006 Kawamura et al. ........... 438/292
2008/0185643 A1 8/2008 Hossain
2010/0308399 A1 12/2010 Saito et al.

FOREIGN PATENT DOCUMENTS

JP 2003-303965 10/2003
JP 2004-158868 6/2004
JP 2007-36213 2/2007
KR 10-2001-0039202 5/2001

OTHER PUBLICATIONS

Marina Antoniou, et al., "The Semi-Superjunction IGBT" IEEE Electron Device Letters, vol. 31, No. 6, Jun. 2010, pp. 591-593.
Office Action, issued Mar. 29, 2013, in Korean Patent Application No. 10-2011-0130028, with English-language partial translation, 5 pages.
Office Action mailed Apr. 8, 2013 in German Application No. 10 2011 085 196.8 (w/English translation).

(Continued)

*Primary Examiner* — Calvin Lee
*Assistant Examiner* — Monica D Harrison
(74) *Attorney, Agent, or Firm* — Oblon, Spivak, McClelland, Maier & Neustadt, L.L.P.

(57) ABSTRACT

A trench gate IGBT designed to reduce on-state voltage while maintaining the withstand voltage, including a first drift layer formed on a first main surface of a buffer layer, a second drift layer of the first conductivity type formed on said first drift layer, a base layer of a second conductivity type formed on the second drift layer, an emitter layer of the first conductivity type selectively formed in the surface of the base layer, and a gate electrode buried from the surface of the emitter layer through into the second drift layer with a gate insulating film therebetween, wherein said first drift layer has a structure in which a first layer of the first conductivity type and a second layer of the second conductivity type are repeated in a horizontal direction.

26 Claims, 17 Drawing Sheets

5 6 8 7 9
10
4
3
1
L2
2
14
11
12
13

OTHER PUBLICATIONS

Bauer, Friedhelm D., "The super junction bipolar transistor: a new silicon power device concept for ultra low loss switching applications at medium to high voltages", Solid-State Electronics 48, (2004), pp. 705-714.

Bauer, Friedhelm, "The MOS Controlled Super Junction Transistor (SJBT): a new, highly efficient, high power semiconductor device for medium to high voltage applications", Proceedings of the 14th International Symposium on Power Semiconductor Devices and ICs, 2002, pp. 197-200.

Antoniou, M. et al., "The 3.3k V Semi-Super Junction IGBT for Increased Cosmic Ray Induced Breakdown Immunity", 21st International Symposium on Power Semiconductor Devices and ICs, 2009, pp. 168-171.

Antoniou, M. et al., "A new way to alleviate the RC IGBT snapback phenomenon: The SuperJunction Solution", 22nd Internation Symposium on Power Semiconductor Devices and ICs, 2010, pp. 153-156.

* cited by examiner

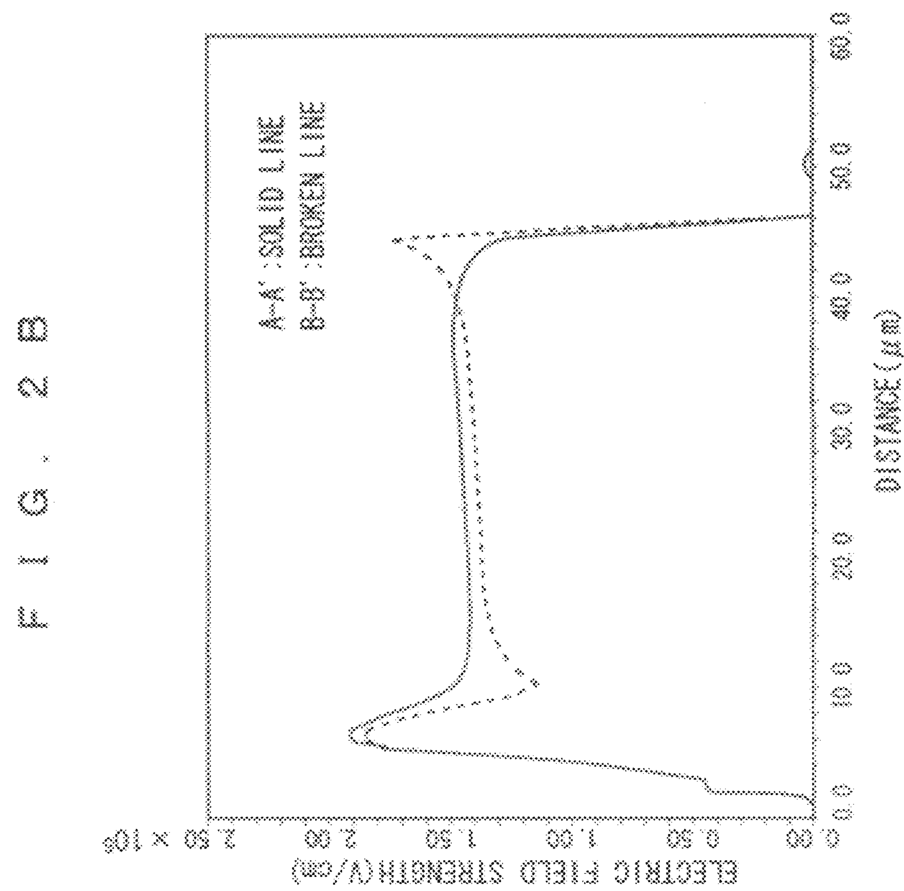
F I G . 2 B
A-A' : SOLID LINE
B-B' : BROKEN LINE
DISTANCE (μm)
0.0
10.0
20.0
30.0
40.0
50.0
60.0
ELECTRIC FIELD STRENGTH (V/cm)
0.00
0.50
1.00
1.50
2.00
2.50 × 10^5
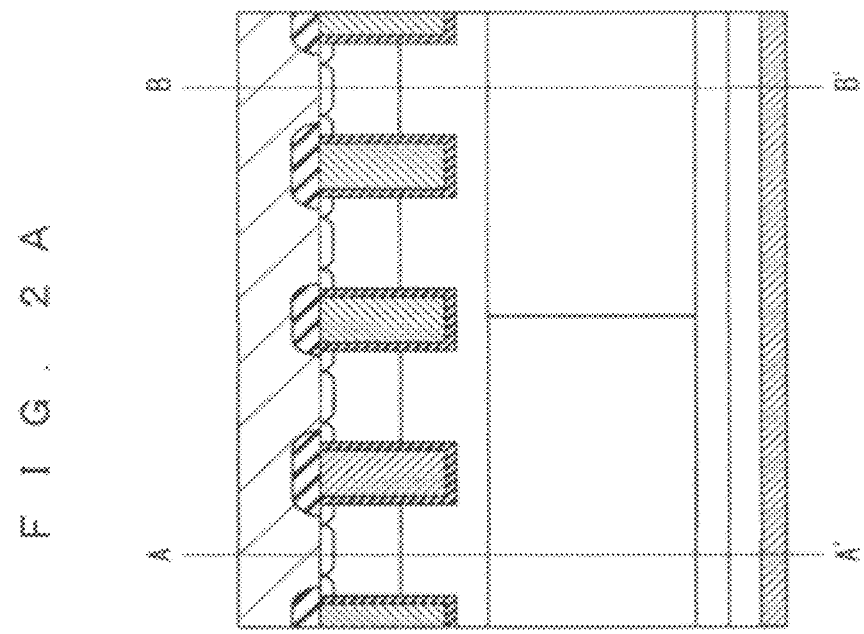
F I G . 2 A
A
A'
B
B'

F I G . 3
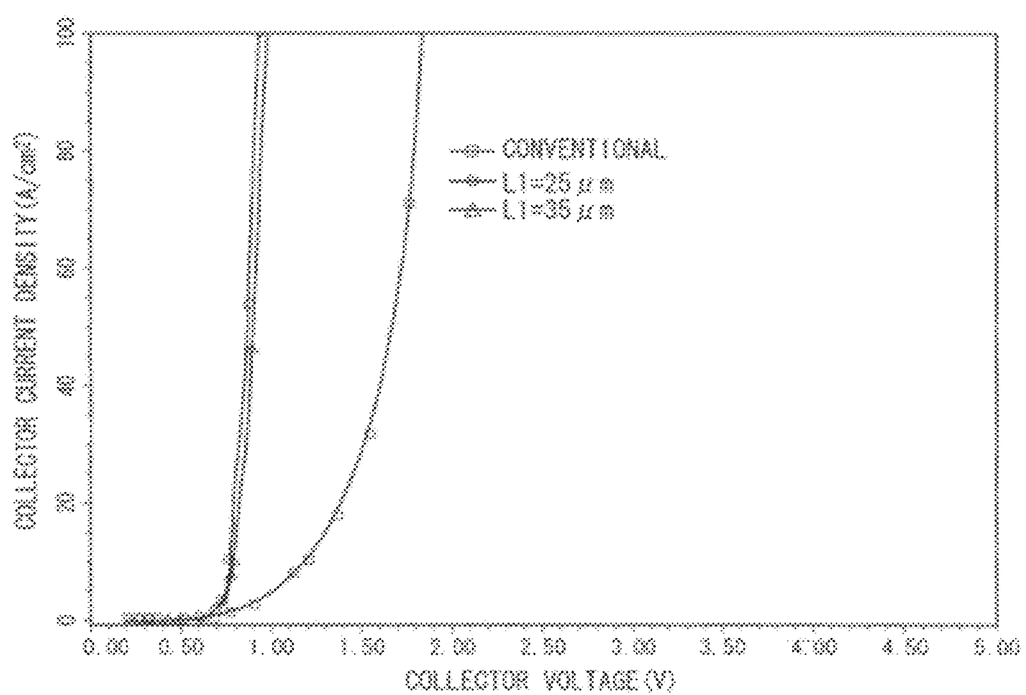

F I G. 4
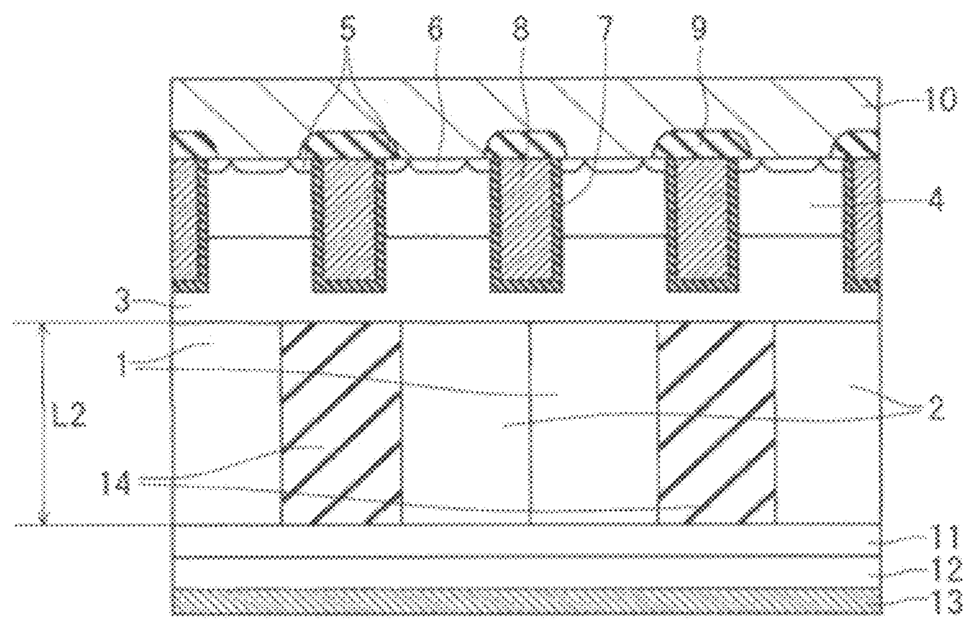

F I G. 6
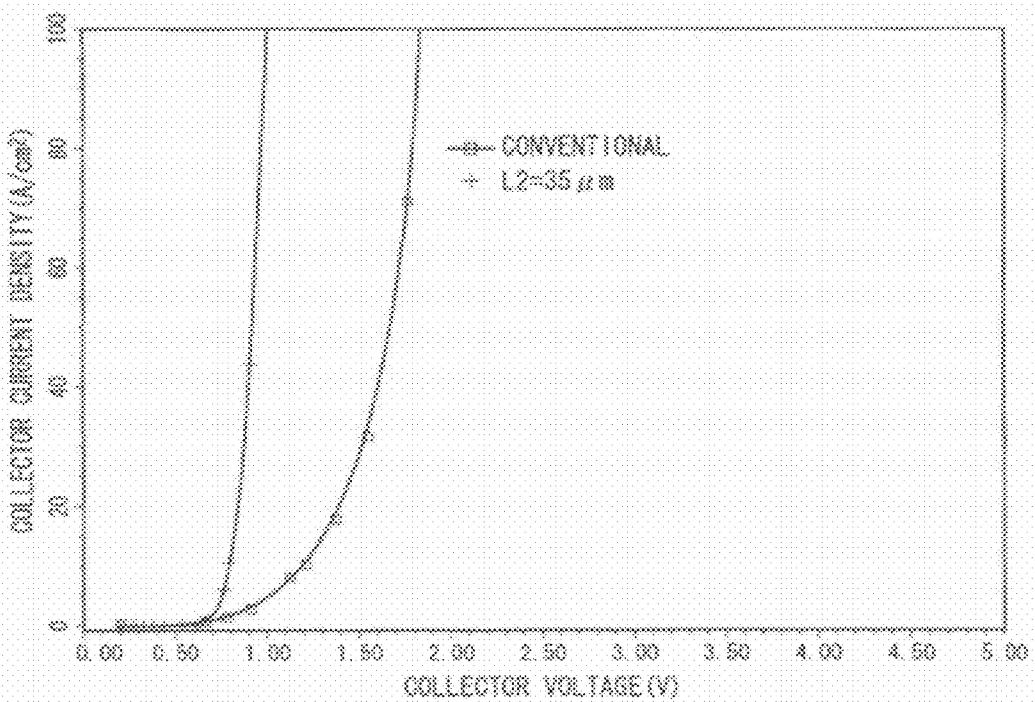

A

A'

F I G. 10
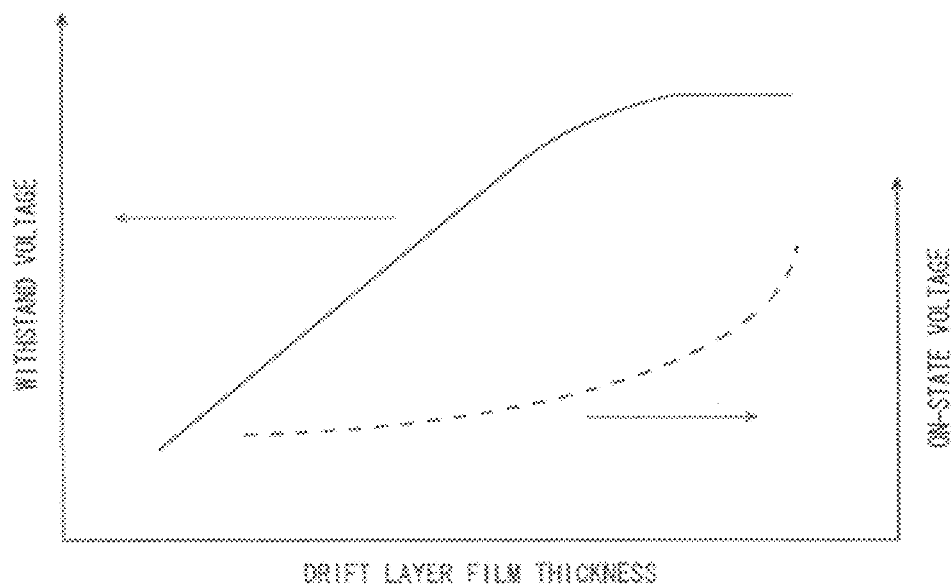
F I G. 11
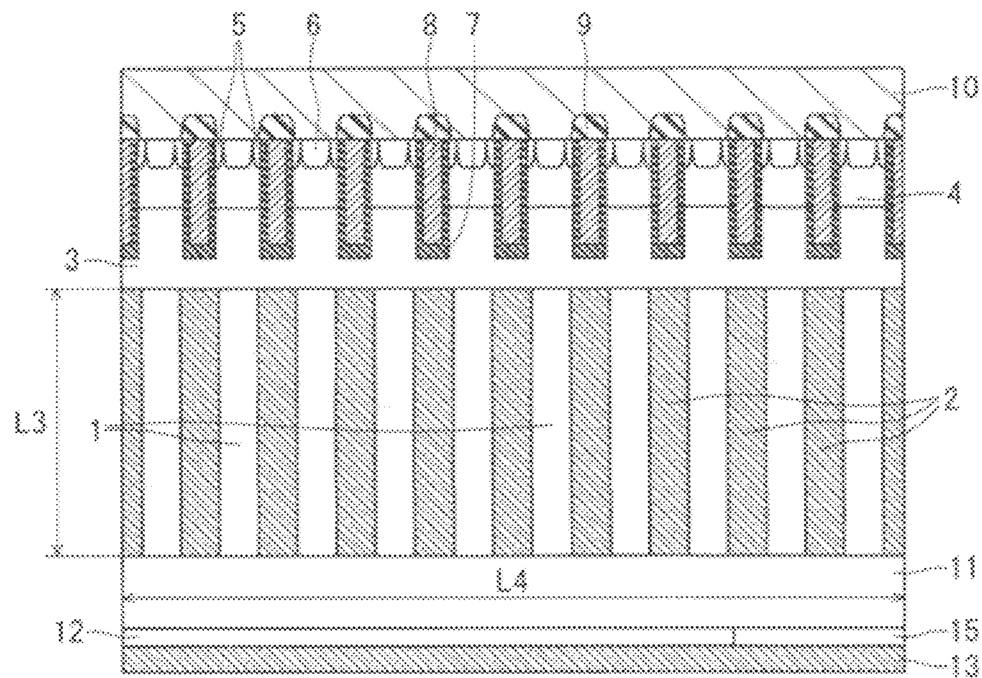

F I G. 1 3
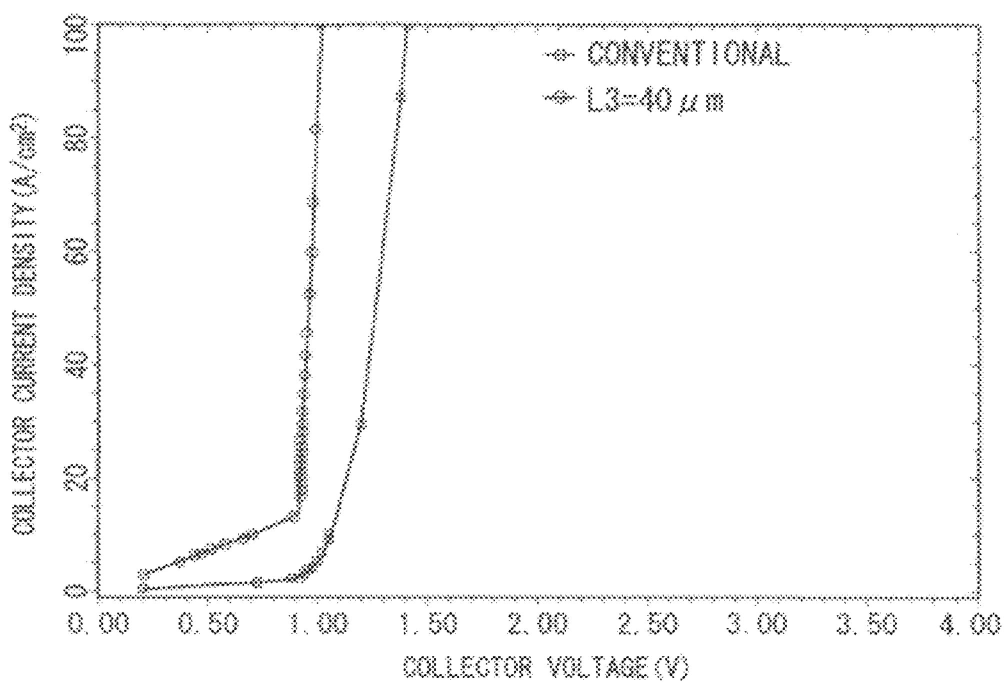
F I G. 1 4
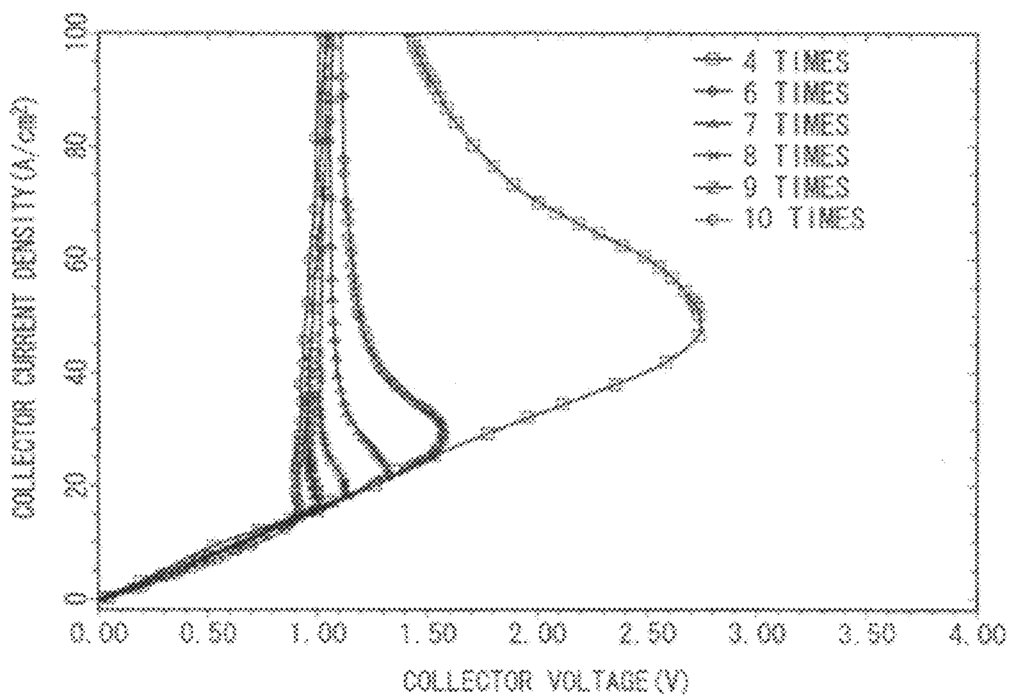

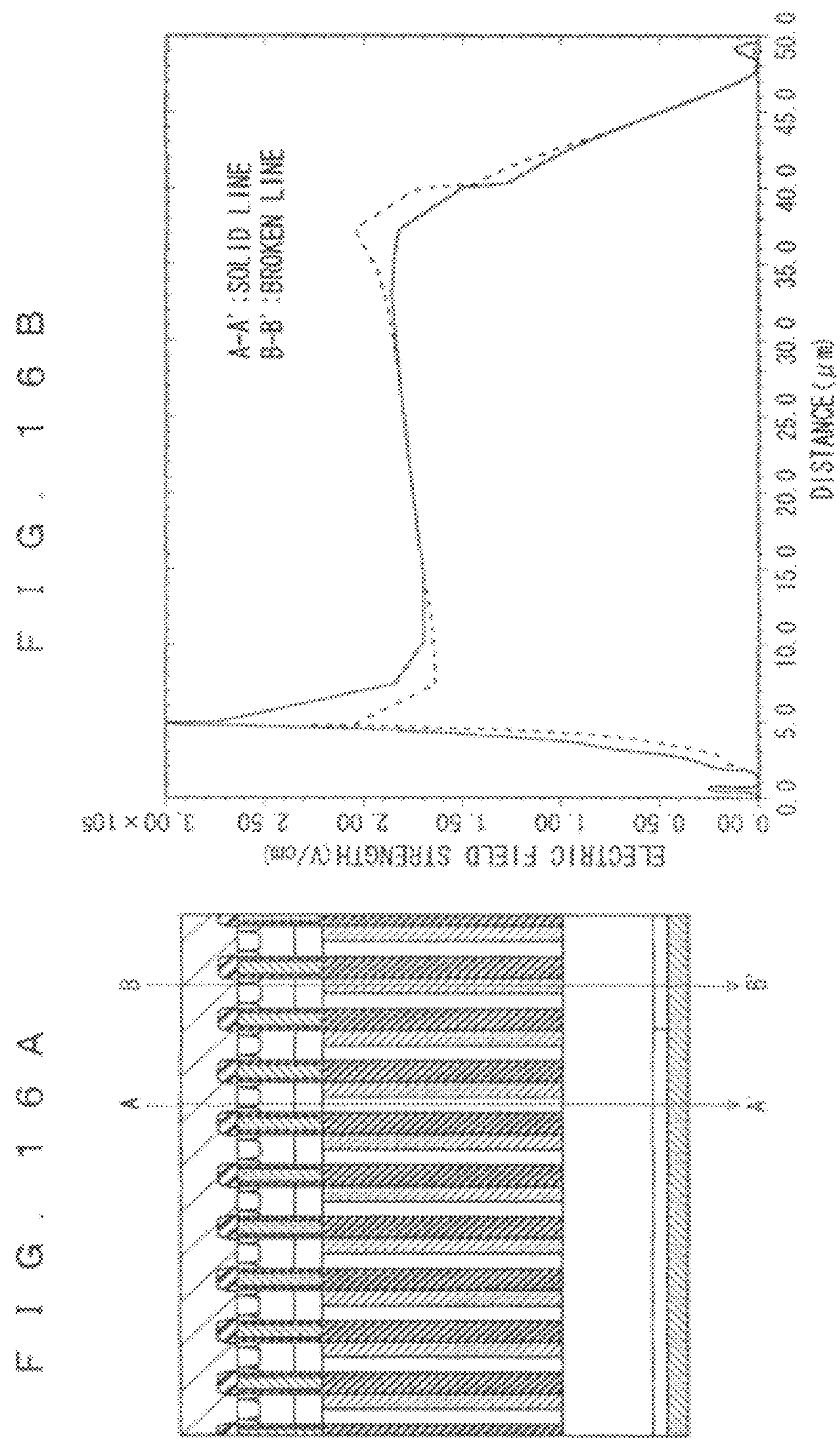
F I G . 1 6 A
A
A'
B
B'
F I G . 1 6 B
A-A' : SOLID LINE
B-B' : BROKEN LINE
ELECTRIC FIELD STRENGTH (V/cm)
3.00×10⁵
2.50
2.00
1.50
1.00
0.50
0.00
0.0
5.0
10.0
15.0
20.0
25.0
30.0
35.0
40.0
45.0
50.0
DISTANCE (μm)

F I G . 1 7
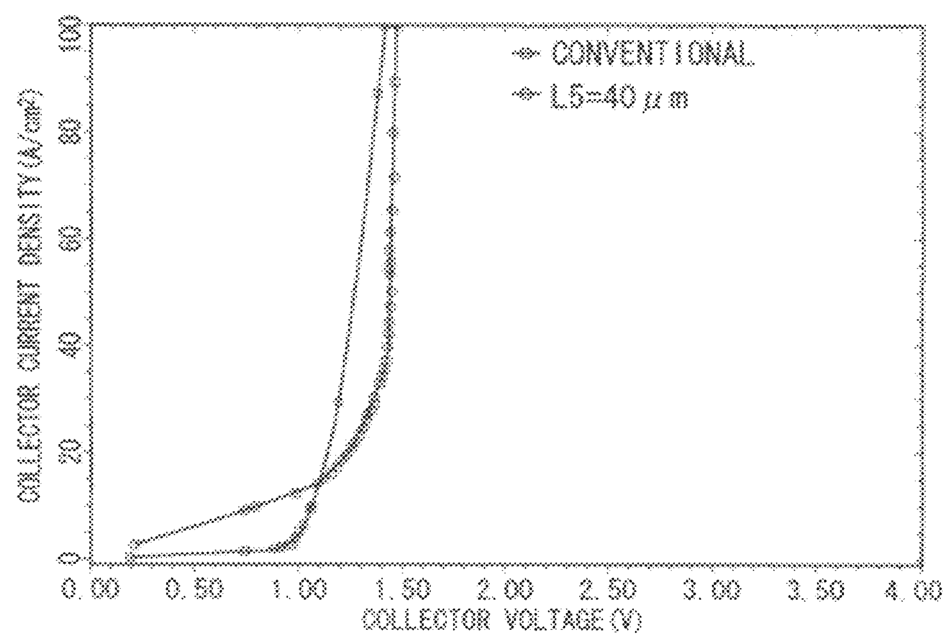
F I G . 1 8
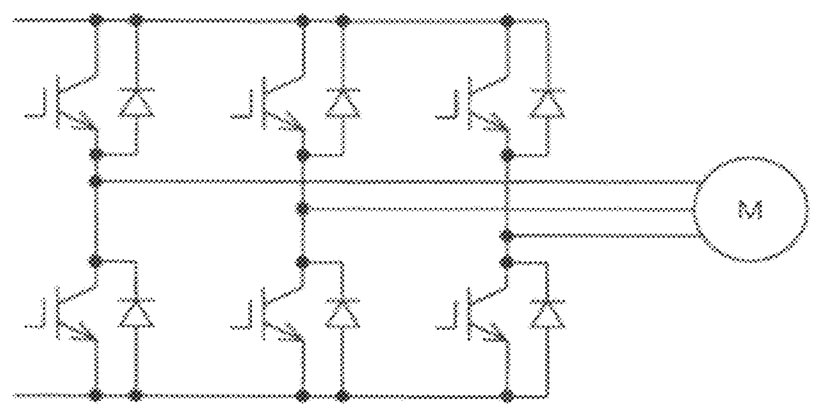

F I G. 2 1
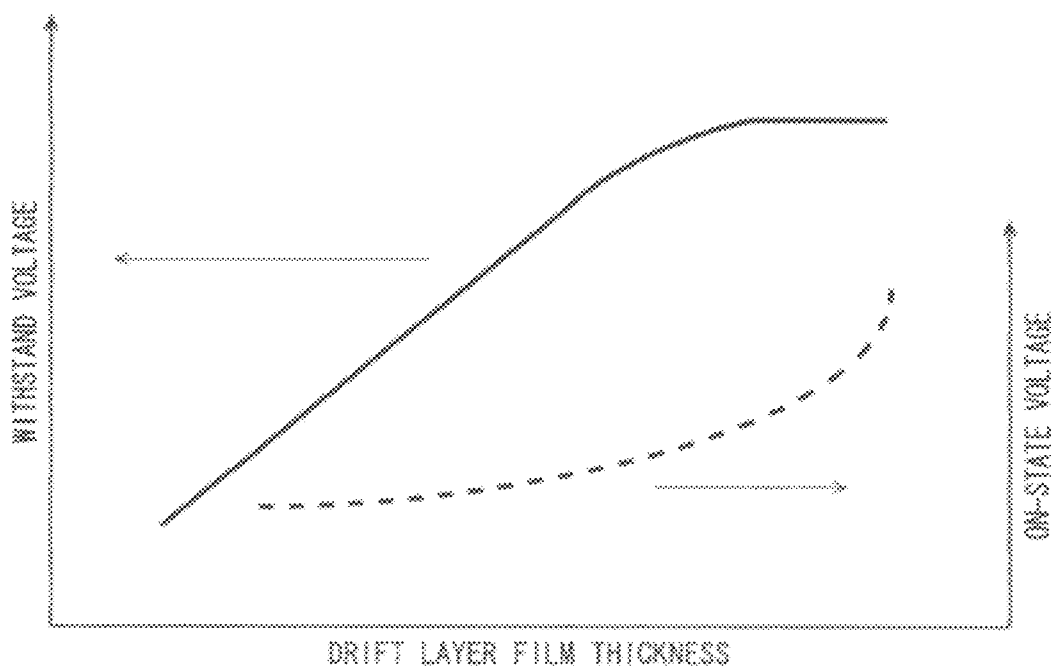

INSULATED GATE BIPOLAR TRANSISTOR AND MANUFACTURING METHOD THEREOF

BACKGROUND OF THE INVENTION

1. Field of the Invention

The present invention relates to insulated gate bipolar transistors.

2. Description of the Background Art

Recently, inverter devices are used in the fields of household electrical appliances and industrial power apparatuses. An inverter device using commercial power supply (AC power supply) includes a converter part for converting AC power supply into DC, a smoothing circuit part, and an inverter part for inverting the DC voltage into AC. As to the main power elements in the inverter part, insulated gate bipolar transistors (hereinafter also referred to as IGBT (Insulated Gate Bipolar Transistor)) capable of high-speed switching are the mainstream.

In an inverter device for controlling power, the current rating and voltage rating per one transistor chip are around in the ranges of several A to several hundreds A and several hundreds V to several thousands V, respectively. Accordingly, in a circuit in which the gate voltage of the IGBT is continuously varied by using a resistance load, the power as the product of current and voltage is generated as heat inside the IGBT, so a large radiator is necessary, and the conversion efficiency of power is poor. Also, depending on the combination of operating voltage and operating current, the temperature of the transistor itself rises and it undergoes thermal breakage, and so a resistance load circuit is not often used.

The load of an inverter device is mostly an electric induction machine (a motor of inductive load), and IGBTs operate as switches and control the power energy by repeating off state and on state. When an inverter circuit is switched with an inductive load, a turn-off process from on state to off state of the transistor, a turn-on process from off state to on state, and on state of the transistor can be thought.

The inductive load is connected to a middle potential point between the upper and lower arms, and the directions of current passed to the inductive load are both positive and negative directions. Current passing through the load is returned from the load connection end to the high-potential power supply side, or passed to the ground side, so free-wheel diodes are necessary to circulate the large current flowing in the inductive load between the load and arm's closed circuit side.

In small-capacity inverter devices, MOSFETs (Metal Oxide Silicon Field Effect Transistors) may be used in place of IGBTs.

As structures for making the on-state voltage of IGBTs small, trench gate IGBTs (see Japanese Patent Application Laid-Open No. 2004-158868 (Patent Document 1)), carrier accumulating trench gate IGBTs, etc. are suggested.

The trench gate IGBT described in Patent Document 1 requires an N-base layer having a certain thickness in order to hold the withstand voltage, but making the N-base layer thick causes the on-state voltage to be high.

SUMMARY OF THE INVENTION

An object of the present invention is to provide a trench gate IGBT that can reduce the on-state voltage while holding the withstand voltage and a manufacturing method thereof.

An insulated gate bipolar transistor of the present invention includes a buffer layer of a first conductivity type, a first drift layer, a second drift layer of the first conductivity type, a base layer of a second conductivity type, an emitter layer of a first conductivity type, a gate electrode, a collector layer of the second conductivity type, and a collector electrode. The first drift layer is formed on a first main surface of the buffer layer. The second drift layer is formed on the first drift layer. The base layer is formed on the second drift layer. The emitter layer is formed selectively in the surface of the base layer. The gate electrode is buried from the surface of the emitter layer through into the second drift layer with a gate insulating film therebetween. The emitter electrode conducts with the emitter layer. The collector layer is formed on a second main surface of the buffer layer. The collector electrode is formed on the collector layer. The first drift layer has a structure in which a first layer of the first conductivity type and a second layer of the second conductivity type are repeated in a horizontal direction.

The first drift layer has a structure in which a first layer of the first conductivity type and a second layer of the second conductivity type are repeated in the horizontal direction, whereby it is possible to reduce the on-state voltage while holding the withstand voltage.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2A and 2B are diagrams showing the electric field strength distribution in the depletion layer of the IGBT of the first preferred embodiment;

FIG. 3 is a diagram showing the on-state voltage of the IGBT of the first preferred embodiment;

FIG. 4 is a cross-sectional view illustrating the structure of an IGBT according to a second preferred embodiment;

FIG. 6 is a diagram showing the on-state voltage of the IGBT of the second preferred embodiment;

FIG. 10 is a diagram illustrating a property between on-state voltage and withstand voltage;

FIG. 11 is a cross-sectional view illustrating the structure of an RC-IGBT according to a third preferred embodiment;

FIG. 13 is a diagram showing the on-state voltage of the RC-IGBT of the third preferred embodiment;

FIG. 14 is a diagram illustrating a relation between the repetition pitch of collector layers and snap-back voltage;

FIGS. 16A and 16B are diagrams showing the electric field strength distribution in the depletion layer of the RC-IGBT of the fourth preferred embodiment;

FIG. 17 is a diagram showing the on-state voltage of the RC-IGBT of the fourth preferred embodiment;

FIG. 18 is a circuit diagram illustrating an inverter circuit having IGBTs and free-wheel diodes;

FIG. 21 is a diagram illustrating a property between on-state voltage and withstand voltage.

DESCRIPTION OF THE PREFERRED EMBODIMENTS

Preliminary Technique

Figure 7:
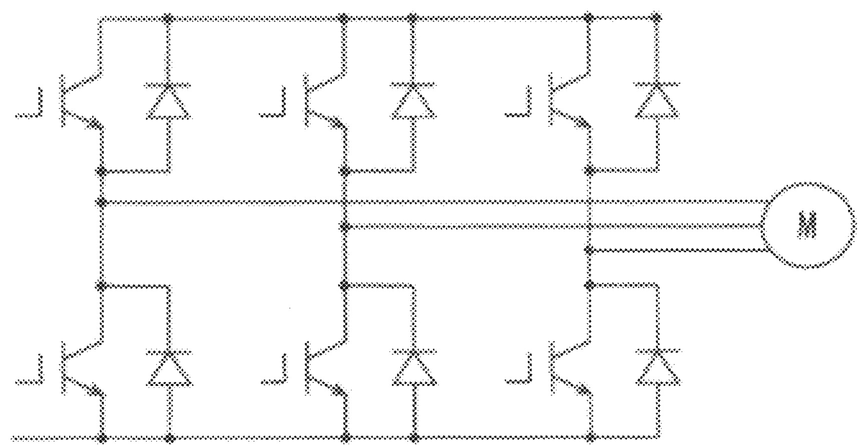
FIG. 7 is a circuit diagram illustrating an inverter circuit having IGBTs and free-wheel diodes.

FIG. 7 shows an example of an inverter circuit using IGBTs and free-wheel diodes. A plurality of IGBTs are connected in series and parallel, and a free-wheel diode is connected between the emitter and collector of IGBT. The load is an electrical induction machine.

Figure 8:
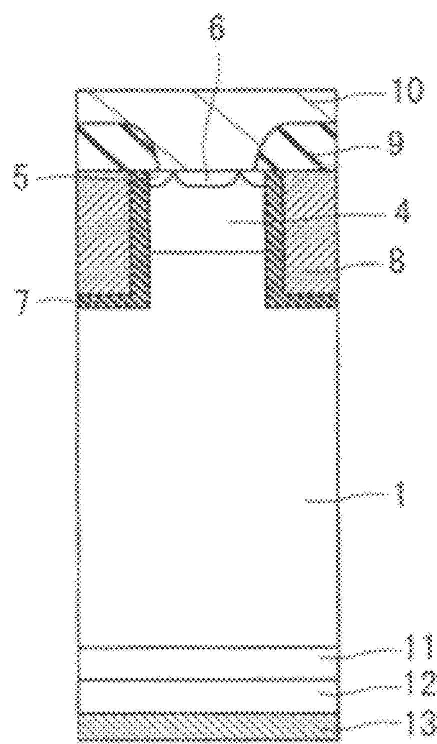
FIG. 8 is a cross-sectional view illustrating the structure of a trench gate IGBT.

Preliminary techniques for making the on-state voltage smaller include the trench gate IGBT whose structure is shown in FIG. 8.

In the trench gate IGBT, an N-drift layer 1 is formed over a P collector layer 12 with an N buffer layer 11 therebetween, and a P base layer 4 is formed on the N-drift layer 1. N emitter layers 5 and a P-contact layer 6 are formed in the surface of the P base layer 4.

Also, trenches are formed from the surface of the P base layer 4 to a certain depth in the N-drift layer 1, and a gate electrode 8 is formed in each trench with an insulating gate film 7 therebetween. An emitter electrode 10 is formed on the P-contact layer 6, and the gate electrodes 8 and the emitter electrode 10 are insulated by interlayer insulating films 9.

When a gate voltage of threshold voltage Vth or higher is applied to the gate electrodes 8, the region of the P base layer 4 between the N emitter layers 5 and the N-drift layer 1 is inverted to N type, and electrons are injected from the N emitter layers 5 to the N-drift layer 1. With the gate voltage of or higher than Vth being applied, when a collector voltage high enough to forward bias the PN junction of the P collector layer 12 and the N buffer layer 11 is applied to the collector electrode 13, holes are injected from the collector electrode 13 to the N-drift layer 1, and conductivity modulation occurs and the resistance value rapidly falls, and it has sufficient current passing ability.

When a negative bias is applied to the gate electrodes 8 and certain voltage is applied between the emitter electrode 10 and the collector electrode 13 (emitter voltage<collector voltage), a depletion layer extends from the P base layer 4 into the N-drift layer 1, and the N-drift layer 1 is depleted to hold the withstand voltage.

Figures 9A, 9B:
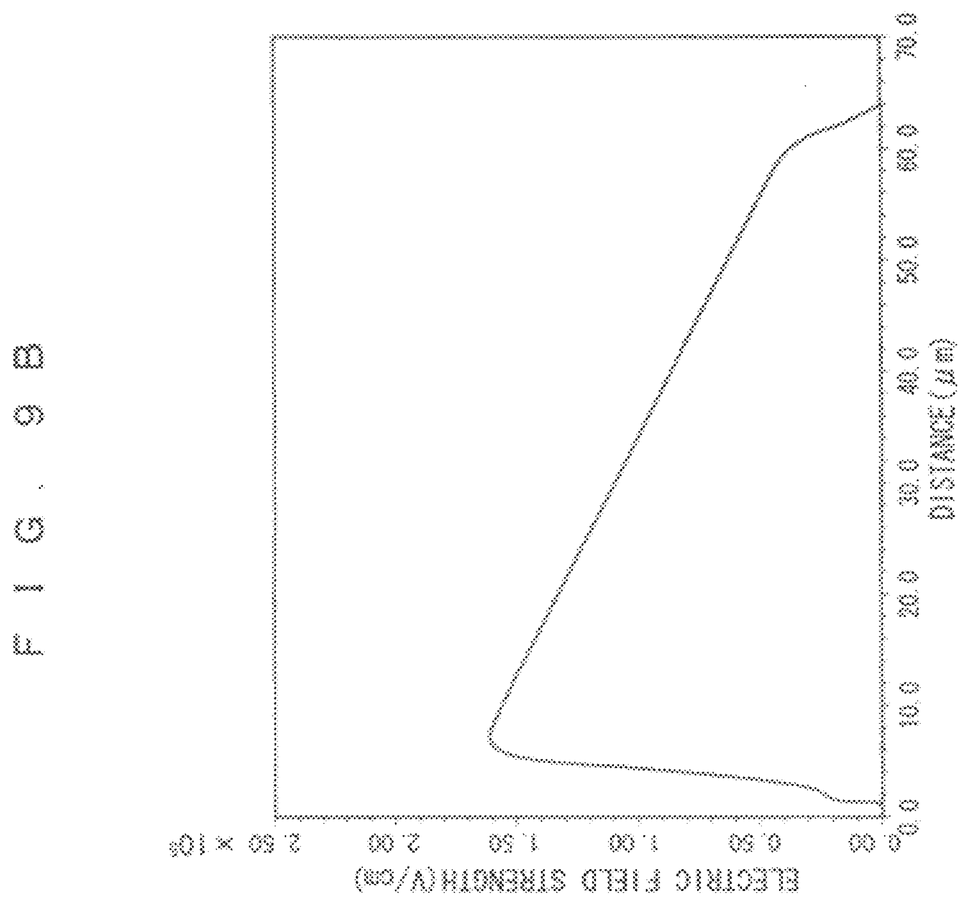
FIGS. 9A and 9B are diagrams showing the electric field strength distribution in the depletion layer of the trench gate IGBT.

FIG. 9A shows a cross section of the IGBT shown in FIG. 8. FIG. 9B shows a simulation of the electric field strength distribution in the depletion layer occurring when a voltage of 600 V is applied between the emitter and collector when the IGBT in FIG. 9A is off, where the simulation is shown along the section A-A' in FIG. 9A. According to the results, it is a so-called triangular electric field strength distribution in which the electric field concentrates most in the PN junction portion of the P base layer 4 and the N-drift layer 1. While the electric field strength in the PN junction portion is about $1.9\times10^5$ (V/cm), when the film thickness of the N-drift layer 1 is thinned to make the on-state voltage smaller, the electric field strength in the PN junction portion exceeds the critical electric field strength and breakdown occurs.

FIG. 10 shows a property between on-state voltage (dotted line) and withstand voltage (solid line) with respect to the thickness of the N-drift layer 1. As shown in FIG. 10, thinning the N-drift layer 1 to reduce the on-state voltage also reduces the withstand voltage, and the reduction of on-state voltage and the improvement of withstand voltage are in a trade-off relation with respect to the thickness of the N-drift layer 1.

Accordingly, this preferred embodiment proposes an IGBT that achieves both of the reduction of on-state voltage and the improvement of withstand voltage by improving the electric field strength distribution in the depletion layer.

First Preferred Embodiment

Structure

Figure 1:
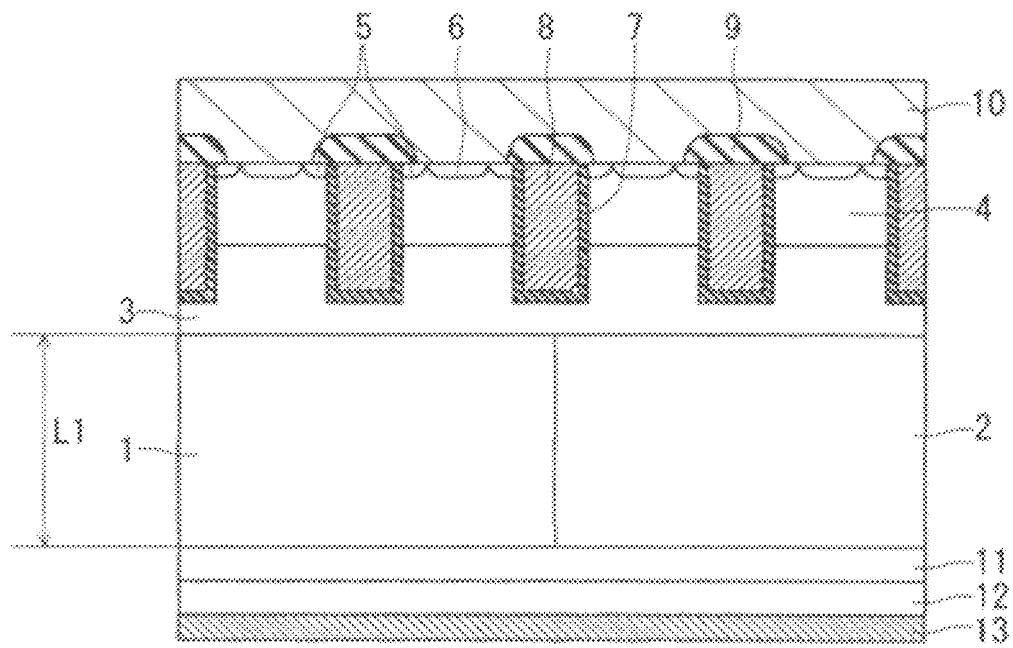
FIG. 1 is a cross-sectional view illustrating the structure of an IGBT according to a first preferred embodiment.

FIG. 1 is a cross-sectional view of a trench gate IGBT according to a first preferred embodiment.

In the IGBT of this preferred embodiment, a drift layer is formed over a P collector layer 12 with an N buffer layer 11 therebetween. The drift layer has a two-layered structure of a first drift layer and an N-drift layer 3 as a second drift layer. The first drift layer has a super junction structure in which an N-drift layer 1 as a first layer and a P-drift layer 2 as a second layer are repeated in the horizontal direction in the diagram. The thicknesses of the N-drift layer 1 and the P-drift layer 2 are both L1. FIG. 1 shows one N-drift layer 1 and one P-drift layer 2.

A P base layer 4 is formed on the N-drift layer 3, and N emitter layers 5 and P-contact layers 6 are formed in the surface of the P base layer 4.

Trenches are formed from the surface of the N emitter layers 5 through the P base layer 4 to a certain point in the N-drift layer 3, and a gate electrode 8 is formed in each trench with an insulating gate film 7 therebetween. An emitter electrode 10 is formed on the P-contact layers 6, and the gate electrodes 8 and the emitter electrode 10 are insulated by interlayer insulating films 9.

Operation

When a positive voltage is applied to the gate electrodes 8, the region of the P base layer 4 between the N emitter layers 5 and the N-drift layer 3 is inverted to N type, and electrons are injected from the N emitter layers 5 into the N-drift layer 3, and this IGBT conducts forward. With a gate voltage of or higher than the threshold Vth being applied to the gate electrodes 8, when a collector voltage high enough to forward bias the PN junction between the P collector layer 12 and the N buffer layer 11 is applied to the collector electrode 13, holes are injected from the collector electrode 13 into the N-drift layer 1 and conductivity modulation occurs, and the resistance value of the first and second drift layer rapidly falls and it has sufficient current conducting ability.

When a negative bias is applied to the gate electrodes 8 and a certain voltage is applied to the emitter electrode 10 and the collector electrode 13 (emitter voltage<collector voltage), a depletion layer extends from the P base layer 4 toward the N-drift layer 3 and the repetition structure of the N-drift layer 1 and the P-drift layer 2. When the amounts of carriers contained in the N-drift layer 1 and the P-drift layer 2 are adjusted the same, the N-drift layer 1 and the P-drift layer 2 are completely depleted, and a high electric field can be held.

FIG. 2B shows a simulation of the electric field strength distribution in the depletion layer occurring when a voltage of 600 V is applied between the emitter and collector when the IGBT of this preferred embodiment is off. The film thickness of the N-drift layer 3 was set at 4 μm, and the film thickness of the N-drift layer 1 and the P-drift layer 2 was set at 35 μm. FIG. 2A shows a cross section of the same IGBT as that of FIG. 1. The solid line of FIG. 2B shows the electric field strength distribution along line A-A' passing through the N-drift layer 1, and the broken line of FIG. 2B shows the electric field strength distribution along line B-B' passing through the P-drift layer 2. According to the results of simulation, the electric field strength distribution in the depletion layer is almost trapezoidal. While the electric field strength takes the maximum value $1.9\times10^5$ V/cm in the PN junction portion of the P base layer 4 and the N-drift layer 3, it is within the critical electric field strength. The first drift layer has a super junction structure, and so this structure can be completely depleted. Accordingly, as compared with conventional structures, the withstand voltage can be maintained even when the drift layer is formed thinner.

Next, FIG. 3 shows a simulation about the collector voltage-collector current density characteristic, wherein, in the IGBT of this preferred embodiment, the thickness L1 of the N-drift layer 1 and P-drift layer 2 is varied as 25 μm and 35 μm. For comparison, the value of the IGBT having the conventional structure of FIG. 8 is also shown, wherein the film thickness of the N-drift layer 1 is set at 60 μm. When L1=25 μm and 35 μm, the film thickness of the upper N-drift layer 3 is 4 μm. From FIG. 3, while, in the conventional structure, the on-state voltage at which the collector current density becomes about 100 A/$cm^2$ is about 1.8V, the on-state voltage of the structure of this preferred embodiment is reduced to 1.0 V both when L1=25 and 35 μm.

In this way, according to the IGBT of this preferred embodiment, it is possible to make the on-state voltage small while maintaining the withstand voltage by properly selecting the impurity concentrations and film thickness L1 of the N-drift layer 1 and P-drift layer 2.

The description above has illustrated the conductivity types of individual layers defined as N type and P type, but the same effects are obtained when these conductivity types are all inverted.

The IGBT of this preferred embodiment is generally formed of silicon (Si), but it may be formed of wide band-gap semiconductor having larger band gap than silicon. Wide band-gap semiconductors include silicon carbide (SiC), gallium nitride (GaN) materials or diamond, for example. For instance, silicon carbide has critical breakdown electric field strength ten times higher than that of silicon, so that, when silicon carbide is used, the withstand voltage can be maintained even when the film thickness L1 of the N-drift layer 1 and P-drift layer 2 is made thinner to one-tenth as compared with when using silicon.

Also, it is not essential to form the super junction structure of the first drift layer directly on the N buffer layer 11, but the effects of the present invention are obtained also when an N-drift layer as a third drift layer is provided between the super junction structure of the first drift layer and the N buffer layer 11.

Effects

The IGBT of this preferred embodiment includes: a buffer layer (N buffer layer 11) of a first conductivity type; first drift layers 1, 2 formed on a first main surface of the N buffer layer 11; a second drift layer (N-drift layer 3) of the first conductivity type formed on the first drift layers 1 and 2; a base layer (P base layer 4) of a second conductivity type formed on the N-drift layer 3; emitter layers (N emitter layers 5) of the first conductivity type selectively formed in the surface of the P base layer 4; gate electrodes 8 buried from the surfaces of the N emitter layers 5 through into the N-drift layer 3 with gate insulating films 7 therebetween; an emitter electrode 10 conducting to the N emitter layers 5, a collector layer (P collector layer 12) of the second conductivity type formed on a second main surface of the N buffer layer 11; and a collector electrode 13 formed on the P collector layer 12, wherein the first drift layers 1 and 2 have a structure in which a first layer (N-drift layer 1) of the first conductivity type and a second layer (P-drift layer 2) of the second conductivity type are repeated in a horizontal direction, whereby the on-state voltage can be reduced while ensuring the withstand voltage.

Also, the N-drift layer 1 and the P-drift layer 2 as the first drift layer are formed of wide band-gap semiconductor, so that the on-state voltage can be further reduced as compared with common band-gap semiconductor such as Si.

Also, the IGBT of this preferred embodiment includes: a buffer layer (N buffer layer 11) of a first conductivity type; a third drift layer (N-drift layer) of the first conductivity type formed on a first main surface of the N buffer layer 11; first drift layers 1, 2 formed on said N-drift layer; a second drift layer (N-drift layer 3) of the first conductivity type formed on the first drift layers 1 and 2; a base layer (P base layer 4) of a second conductivity type formed on the N-drift layer 3; emitter layers (N emitter layers 5) of the first conductivity type selectively formed in the surface of the P base layer 4; gate electrodes 8 buried from the surfaces of the N emitter layers 5 through into the N-drift layer 3 with gate insulating films 7 therebetween; an emitter electrode 10 conducting to the N emitter layers 5, a collector layer (P collector layer 12) of the second conductivity type formed on a second main surface of the N buffer layer 11; and a collector electrode 13 formed on the P collector layer 12, wherein the first drift layers 1 and 2 have a structure in which a first layer (N-drift layer 1) of the first conductivity type and a second layer (P-drift layer 2) of the second conductivity type are repeated in a horizontal direction, whereby the on-state voltage can be reduced while ensuring the withstand voltage.

Second Preferred Embodiment

Structure

FIG. 4 is a cross-sectional view illustrating the structure of an IGBT according to a second preferred embodiment. It differs from the structure of the first preferred embodiment in that the first drift layer is formed of a super junction structure in which an N-drift layer 1, an insulating layer 14 such as $SiO_2$, and a P-drift layer 2 are repeated in the horizontal direction in the drawing. The thicknesses of the N-drift layers 1, insulating layers 14, and P-drift layers 2 are all L2.

In the super junction structure, N-drift layers 1, insulating layers 14, and P-drift layers may be regularly repeated in this order in the horizontal direction, or insulating layers 14 may be inserted in arbitrary positions between the N-drift layers 1 and P-drift layers 2.

In the other respects, the structure is the same as that of the first preferred embodiment, and so the same description is not repeated.

Operation

Basic operation is the same as that of the first preferred embodiment.

When a positive voltage is applied to the gate electrodes 8, a negative voltage is applied to the emitter electrode 10, and a positive voltage is applied to the collector electrode 13, the region of the P base layer 4 between the N emitter layers 5 and the N-drift layer 3 is inverted to N type, and electrons are injected from the N emitter layers 5 into the N-drift layer 3, and this IGBT conducts forward. With a gate voltage of or higher than the threshold Vth being applied to the gate electrodes 8, when a collector voltage high enough to forward bias the PN junction between the P collector layer 12 and the N buffer layer 11 is applied to the collector electrode 13, holes are injected from the collector electrode 13 into the first drift layer and conductivity modulation occurs, and the resistance value of the first and second drift layers rapidly falls and it has sufficient current conducting ability.

When a negative voltage is applied to the gate electrodes 8 and a certain voltage is applied to the emitter electrode 10 and the collector electrode 13 (emitter voltage<collector voltage), a depletion layer extends from the P base layer 4 toward the N-drift layer 3 and the repetition structure of the N-drift layers 1 and the P-drift layers 2. When the amounts of carriers contained in the N-drift layers 1 and the P-drift layers 2 are adjusted the same, the N-drift layers 1 and the P-drift layers 2 are completely depleted, and a high electric field can be held.

Figure 5B:
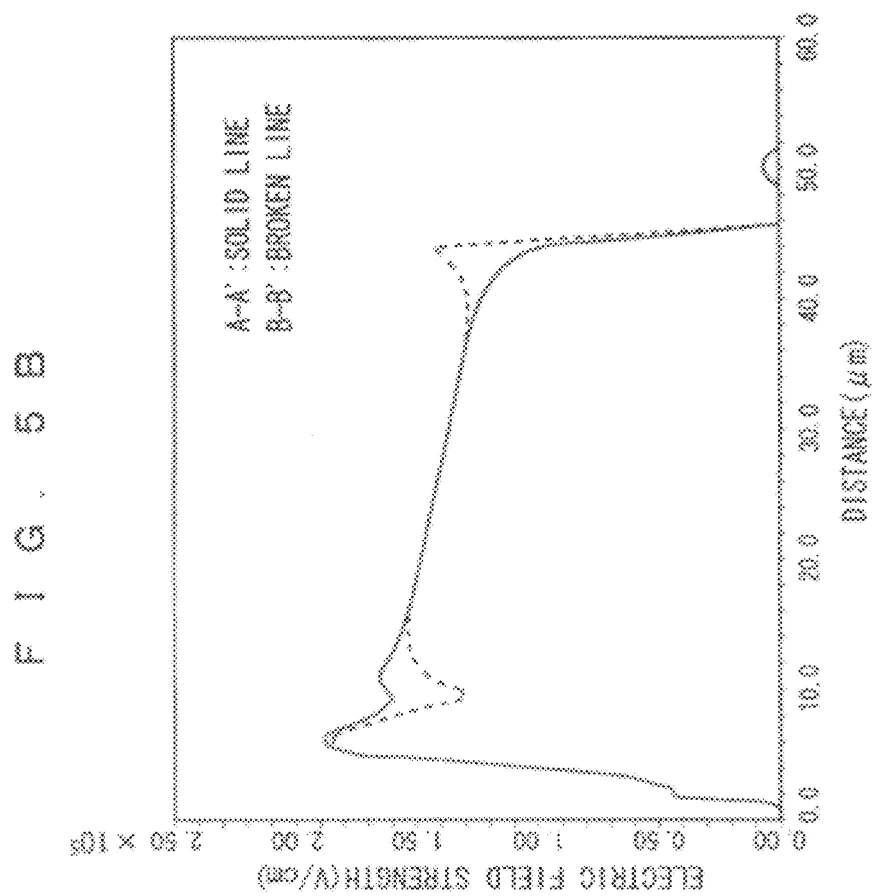
FIGS. 5A and 5B are diagrams showing the electric field strength distribution in a depletion layer of the IGBT of the second preferred embodiment.
Figure 5A:
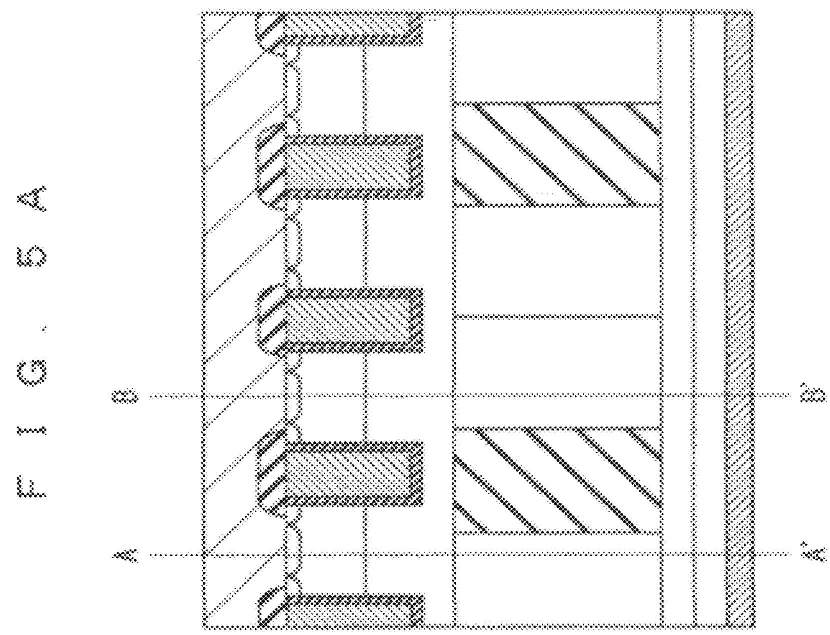

FIG. 5B shows a simulation of the electric field strength distribution in the depletion layer occurring when a voltage of 600 V is applied between the emitter and collector when the IGBT of the second preferred embodiment is off FIG. 5A shows a cross section of the same IGBT as that of FIG. 4. The solid line of FIG. 5B shows the electric field strength distribution along line A-A' passing through the N-drift layer 1, and the broken line of FIG. 5B shows the electric field strength distribution along line B-B' passing through the P-drift layer 2. According to the results of simulation, the electric field strength distribution in the depletion layer is almost trapezoidal. While the electric field strength takes the maximum value of about $1.9\times10^5$ V/cm in the PN junction portion of the P base layer 4 and the N-drift layer 3, it is within the critical electric field strength. The first drift layer has a super junction structure, and so this structure can be completely depleted. Accordingly, as compared with conventional structures, the withstand voltage can be maintained even when the drift layer is formed thinner.

Next, FIG. 6 shows a simulation of the collector voltage-collector current density characteristic, wherein, in the IGBT of this preferred embodiment, the thickness L2 of the N-drift layers 1 and P-drift layers 2 is set at 35 μm. For comparison, the value of the IGBT having the conventional structure of FIG. 8 is also shown, wherein the thickness of the N-drift layer 1 is set at 60 μm. The film thickness of the upper N-drift layer 3 is 4 μm, and the total of the upper N-drift layer 3 and first drift layers is 39 μm. From FIG. 6, while, in the conventional structure, the on-state voltage at which the collector current density becomes about 100 A/$cm^2$ is about 1.8 V, the on-state voltage of the structure of this preferred embodiment is reduced to about 1.0 V.

In this way, according to the IGBT of this preferred embodiment, it is possible to make the on-state voltage small while maintaining the withstand voltage by properly selecting the impurity concentrations and film thickness L2 of the N-drift layer 1 and P-drift layer 2.

The description above has illustrated the conductivity types of individual layers defined as N type and P type, but the same effects are obtained when these conductivity types are all inverted.

Also, it is not essential to form the super junction structure of the first drift layer directly on the N buffer layer 11, but the effects of the present invention are obtained also when an N-drift layer as a third drift layer is provided between the super junction structure of the first drift layer and the N buffer layer 11.

Effects

In the IGBT of this preferred embodiment, it is possible to reduce the on-state voltage while ensuring the withstand voltage as in the first preferred embodiment also with a structure in which insulating films 14 are formed arbitrarily between the first layers (N-drift layers 1) and the second layers (P-drift layers 2).

Or, the IGBT of this preferred embodiment includes: a buffer layer (N buffer layer 11) of a first conductivity type; first drift layers 1, 2 formed on a first main surface of the N buffer layer 11; a second drift layer (N-drift layer 3) of the first conductivity type formed on the first drift layers 1 and 2; a base layer (P base layer 4) of a second conductivity type formed on the N-drift layer 3; emitter layers (N emitter layers 5) of the first conductivity type selectively formed in the surface of the P base layer 4; gate electrodes 8 buried from the surfaces of the N emitter layers 5 through into the N-drift layer 3 with gate insulating films 7 therebetween; an emitter electrode 10 conducting to the N emitter layers 5, a collector layer (P collector layer 12) of the second conductivity type formed on a second main surface of the N buffer layer 11; and a collector electrode 13 formed on the P collector layer 12, wherein the first drift layers 1 and 2 have a structure in which a first layer (N-drift layer 1) of the first conductivity type, an insulating layer 14, and a second layer (P-drift layer 2) of the second conductivity type are repeated in this order in a horizontal direction, whereby the on-state voltage can be reduced while ensuring the withstand voltage.

Or, the IGBT of this preferred embodiment includes: a buffer layer (N buffer layer 11) of a first conductivity type; a third drift layer of the first conductivity type formed on a first main surface of the N buffer layer 11, first drift layers 1, 2 formed on the third drift layer; a second drift layer (N-drift layer 3) of the first conductivity type formed on the first drift layers 1 and 2; a base layer (P base layer 4) of a second conductivity type formed on the N-drift layer 3; emitter layers (N emitter layers 5) of the first conductivity type selectively formed in the surface of the P base layer 4; gate electrodes 8 buried from the surfaces of the N emitter layers 5 through into the N-drift layer 3 with gate insulating films 7 therebetween; an emitter electrode 10 conducting to the N emitter layers 5, a collector layer (P collector layer 12) of the second conductivity type formed on a second main surface of the N buffer layer 11; and a collector electrode 13 formed on the P collector layer 12, wherein the first drift layers 1 and 2 have a structure in which a first layer (N-drift layer 1) of the first conductivity type, an insulating layer 14, and a second layer (P-drift layer 2) of the second conductivity type are repeated in this order in a horizontal direction, whereby the on-state voltage can be reduced while ensuring the withstand voltage.

Third Preferred Embodiment

Preliminary Explanation

When an inverter circuit is switched with an inductive load such as an electric induction machine, as shown in FIG. 18, a free-wheel diode must be provided between the collector and emitter of IGBT in order to circulate the large current flowing in the inductive load between the load and the arm's closed circuit. Accordingly, RC-IGBT in which IGBTs and free-wheel diodes are provided in one chip is proposed.

Figure 19:
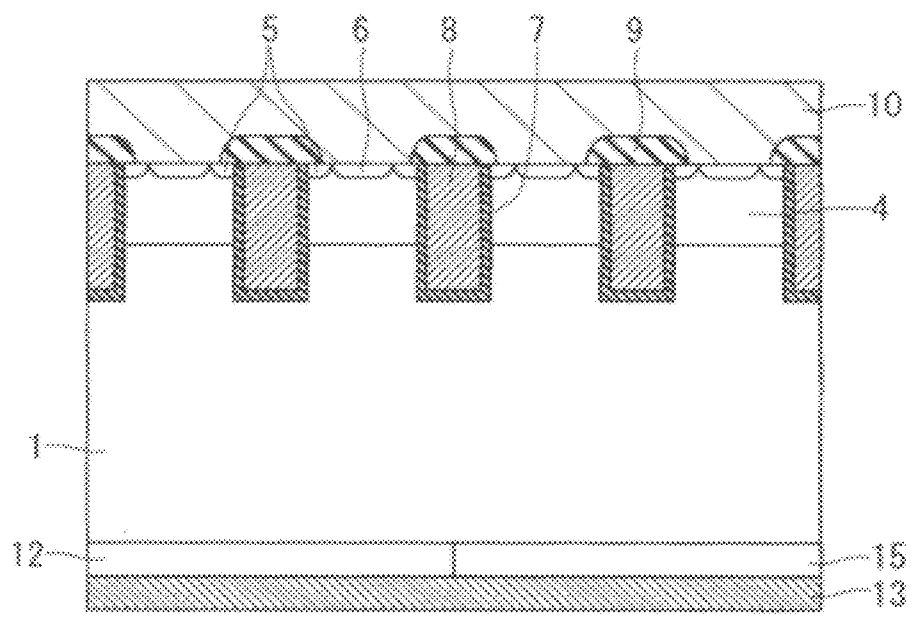
FIG. 19 is a cross-sectional view illustrating the structure of an RC-IGBT according to a preliminary technique.

FIG. 19 shows a cross-sectional view of an RC-IGBT according to a precondition of this preferred embodiment. In the trench gate RC-IGBT shown in FIG. 19, an N-drift layer 1 is formed on a P collector layer 12, and a P base layer 4 is formed on the N-drift layer 1. N emitter layers 5 and P-contact layers 6 are formed in the surface of the P base layer 4.

Also, trenches are formed from the surface of the P base layer 4 to a certain depth in the N-drift layer 1, and a gate electrode 8 is formed in each trench with an insulating gate film 7 therebetween. An emitter electrode 10 is formed on the P-contact layers 6, and the gate electrodes 8 and the emitter electrode 10 are insulated by interlayer insulating films 9.

The P collector layer 12 is not formed in the whole region under the N-drift layer 1, but a P collector layer 12 and an N collector layer 15 are repeated in the horizontal direction under the N-drift layer 1. The N collector layer 15, N-drift layer 1 and P base layer 4 form the PN junction of a free-wheel diode.

When a gate voltage of threshold voltage Vth or higher is applied to the gate electrodes 8, the region of the P base layer 4 between the N emitter layers 5 and the N-drift layer 1 is inverted to N type, and electrons are injected from the N emitter layers 5 to the N-drift layer 1. With the gate voltage of or higher than Vth being applied, when a collector voltage high enough to forward bias the PN junction of the P collector layer 12 and the N-drift layer 1 is applied to the collector electrode 13, holes are injected from the collector electrode 13 to the N-drift layer 1 through the P collector layer 12, and conductivity modulation occurs and the resistance value rapidly falls, and it has sufficient current passing ability.

While in an operating region with lower current density, the operation is MOSFET operation (uni-polar mode), it is necessary to make large the specific resistance of the N-drift layer 1 in order to ensure a certain withstand voltage. Accordingly, the current density range for MOSFET operation cannot be made large.

When a negative bias is applied to the gate electrodes 8 and certain voltage is applied between the emitter electrode 10 and the collector electrode 13 (emitter voltage<collector voltage), a depletion layer extends from the P base layer 4 into the N-drift layer 1, and N-drift layer 1 is depleted and the withstand voltage is held.

Figures 20A, 20B:
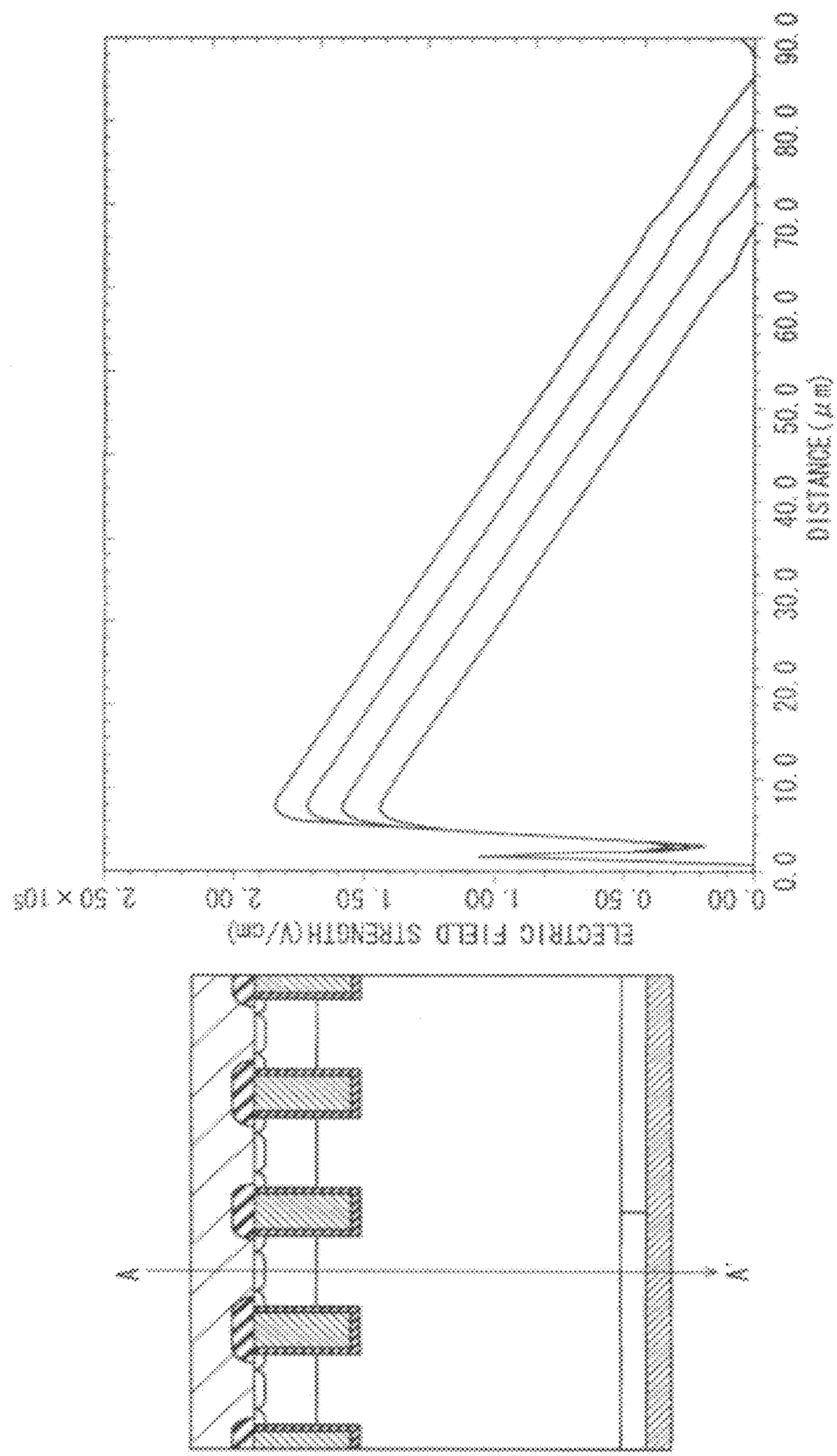
FIGS. 20A and 20B are diagrams showing the electric field strength distribution in the depletion layer in the RC-IGBT of the preliminary technique.

FIG. 20A shows a cross section of the RC-IGBT shown in FIG. 19. FIG. 20B shows a simulation of the electric field strength distribution in the depletion layer occurring when a voltage of 600 V is applied between the emitter and collector when the RC-IGBT shown in FIG. 20A is off, wherein the simulation is shown along the section A-A' of FIG. 20A. According to the results, it is a so-called triangular electric field strength distribution in which the electric field concentrates most in the PN junction portion of the P base layer 4 and the N-drift layer 1. While the electric field strength in the PN junction portion is about $1.9\times10^5$ (V/cm), when the film thickness of the N-drift layer 1 is thinned to make the on-state voltage smaller, the electric field strength in the PN junction portion exceeds the critical electric field strength and breakdown occurs.

FIG. 21 is the same as FIG. 10, which shows a property between on-state voltage (dotted line) and withstand voltage (solid line) with respect to the thickness of the N-drift layer 1. As shown in FIG. 21, thinning the N-drift layer 1 to reduce the on-state voltage also reduces the withstand voltage, and the reduction of on-state voltage and the improvement of withstand voltage are in a trade-off relation with respect to the thickness of the N-drift layer 1.

Accordingly, a third preferred embodiment of the present invention improves the electric field strength distribution in the depletion layer by applying the super junction structure to the RC-IGBT to achieve both of the reduction of on-state voltage and the improvement of withstand voltage.

Structure

FIG. 11 is a cross-sectional view illustrating the structure of an RC-IGBT as an insulated gate bipolar transistor according to a third preferred embodiment.

In the RC-IGBT of this preferred embodiment, a drift layer is formed on a first main surface of an N buffer layer 11. The drift layer has a two-layered structure of a first drift layer and an N-drift layer 3 as a second drift layer. The first drift layer has a super junction structure in which an N-drift layer 1 as a first layer and a P-drift layer 2 as a second layer are repeated in the horizontal direction in the diagram, which is formed by implantation, diffusion, and epitaxial growth processes. The thicknesses of the N-drift layer 1 and the P-drift layer 2 are both L3.

A P base layer 4 is formed on the N-drift layer 3, and N emitter layers 5 and P-contact layers 6 are formed in the surface of the P base layer 4.

Trenches are formed from the surface of the N emitter layer 5 through the P base layer 4 to a certain point in the N-drift layer 3, and a gate electrode 8 is formed in each trench with an insulating gate film 7 therebetween. An emitter electrode 10 is formed on the P-contact layers 6, and the gate electrodes 8 and the emitter electrode 10 are insulated by interlayer insulating films 9.

On the second main surface of the N buffer layer 11, a P collector layer 12 and an N collector layer 15 are repeatedly formed in the horizontal direction in the diagram, and its repetition pitch is L4. A collector electrode 13 is formed on the back of the P collector layer 12 and the N collector layer 15.

The above-described structure of the RC-IGBT is the same as that of the IGBT shown in the first preferred embodiment except for the repeating structure of the P collector layer 12 and the N collector layer 15.

Operation

Next, the operation of the RC-IGBT of this preferred embodiment will be described.

When a positive voltage is applied to the gate electrodes 8, the region of the P base layer 4 between the N emitter layers 5 and the N-drift layer 3 is inverted to N type, and electrons are injected from the N emitter layers 5 into the N-drift layer 3, and this RC-IGBT conducts forward. With a gate voltage of or higher than the threshold Vth being applied to the gate electrodes 8, when a collector voltage high enough to forward bias the PN junction between the P collector layer 12 and the N buffer layer 11 is applied to the collector electrode 13, holes are injected from the collector electrode 13 into the N-drift layer 1 through the P collector layer 12, and conductivity modulation occurs, and the resistance value of the first and second drift layers rapidly falls and it has sufficient current conducting ability.

When a negative bias is applied to the gate electrodes 8 and a certain voltage is applied to the emitter electrode 10 and the collector electrode 13 (emitter voltage<collector voltage), a depletion layer extends from the P base layer 4 toward the N-drift layer 3 and the repetition structure of the N-drift layers 1 and the P-drift layers 2. When the amounts of carriers contained in the N-drift layer 1 and the P-drift layer 2 are adjusted the same, the N-drift layers 1 and the P-drift layers 2 are completely depleted, and a high electric field can be held.

Figure 12B:
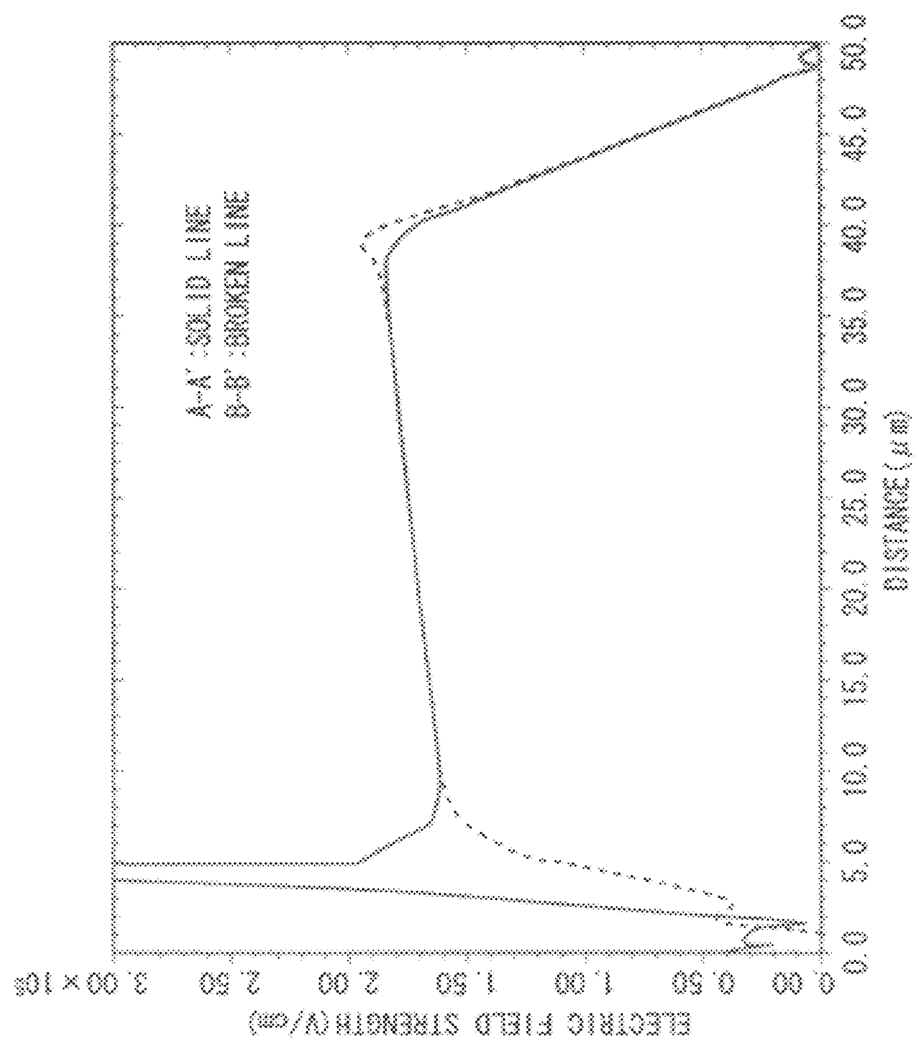
FIGS. 12A and 12B are diagrams showing the electric field strength distribution in the depletion layer of the RC-IGBT of the third preferred embodiment.
Figure 12A:
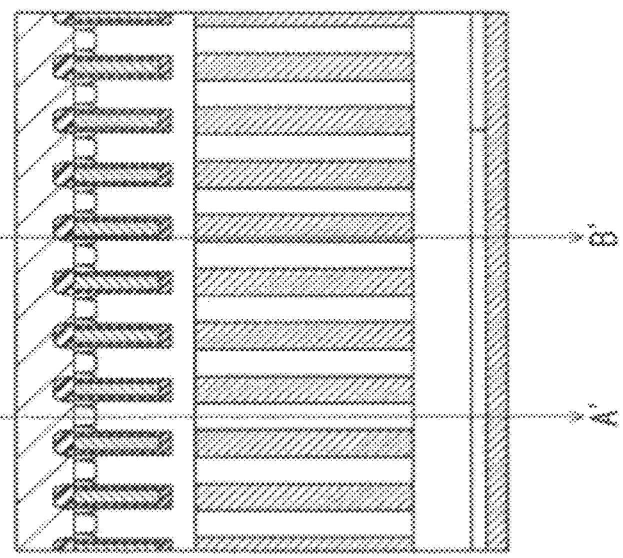

FIG. 12B shows a simulation of the electric field strength distribution in the depletion layer occurring when a voltage of 600 V is applied between the emitter and collector when the RC-IGBT of this preferred embodiment is off. FIG. 12A shows a cross section of the same IGBT as that of FIG. 11. The solid line of FIG. 12B shows the electric field strength distribution along line A-A' passing through the N-drift layer 1, and the broken line of FIG. 12B shows the electric field strength distribution along line B-B' passing through the P-drift layer 2.

According to the results of simulation, the electric field strength distribution in the depletion layer is almost trapezoidal.

Next, FIG. 13 shows a simulation about the collector voltage-collector current density characteristic, wherein, in the RC-IGBT of this preferred embodiment, the thickness L3 of the N-drift layers 1 and P-drift layers 2 is set at 40 μm. For comparison, the value of the RC-IGBT having the conventional structure of FIG. 19 is also shown, wherein the thickness of the N-drift layer 1 is set at 90 μm.

From FIG. 13, while the on-state voltage at which the collector current density of the conventional structure becomes about 100 $A/cm^2$ is about 1.4 V, the on-state voltage of the super junction structure of this preferred embodiment is reduced to about 1.1 V or lower. Also, in the super junction structure of this preferred embodiment, snap-back voltage is small, and the current density in MOSFET operation is 20 $A/cm^2$ or lower, which is about 1/10 to 1/5 of the rating current density. And so the MOSFET operation range can be larger. Furthermore, in the MOSFET operation region, MOSFET characteristic with small on-state resistance is obtained.

The N type impurity concentration can be large by adjusting the N type impurity concentrations in the N-drift layers 1, 3 an the N buffer layer 11

Also, forming the width of the P collector layer 12 larger than that of the N collector layer 15 facilitates the injection of holes from the P collector layer 12. Thus, small snap-back voltage and small on-state resistance are realized. As a condition to make the snap-back voltage small, at the current density at the snap-back peak voltage, it is necessary that a voltage drop occurs in the N buffer layer 11 in the horizontal direction in FIG. 11 so that the potential difference between a middle point of the P collector layer 12 and the N collector layer 15 is not less than 0.5 V, preferably not less than 0.7 V. By setting large the width (horizontal direction in FIG. 11) of the P collector layer 12 to satisfy the above condition, the injection of holes from the collector electrode 13 is facilitated. Thus, MOSFET characteristics with small snap-back voltage and small on-state resistance are obtained. Also, the MOSFET operation range can be set large.

FIG. 14 shows the collector voltage-collector current density characteristic in which the repetition pitch of the P collector layer 12 and the N collector layer 15 (shown as L4 in FIG. 11) is varied to four times, six times, seven times, eight times, nine times, and ten times the cell pitch (the repetition pitch of the N-drift layer 1 and the P-drift layer 2). It is seen from the drawing that the snap-back voltage becomes smaller as the repetition pitch of the P collector layer 12 and the N collector layer 15 becomes larger. It is preferred that the repetition pitch of the P collector layer 12 and the N collector layer 15 be 5 to 15000 times the cell pitch.

In this way, in the RC-IGBT of this preferred embodiment, the impurity concentrations and film thickness L3 of the N-drift layer 1 and the P-drift layer 2 are properly selected, and the repetition pitch of the P collector layer 12 and the N collector layer 15 is set large (by this, the width of the P collector layer 12 can be set large). This makes it possible to make the on-state voltage small while maintaining the withstand voltage, and MOSFET characteristics with small on-state resistance can be obtained with a current density of about 1/10 to 1/5 of the rating current density.

The description above has illustrated the conductivity types of individual layers defined as N type and P type, but the same effects are obtained when these conductivity types are all inverted.

Effects

The insulated gate bipolar transistor of this preferred embodiment further includes a collector layer (N collector layer 15) of a first conductivity type formed on a second main surface of the N buffer layer 1, and that collector layer forms a repetition structure with the collector layer (P collector layer 12) of a second conductivity type in the horizontal direction, and the collector electrode 13 is formed on the P collector layer 12 and the N collector layer 15. Thus, also in such an RC-IGBT, it is possible to make the on-state voltage small while maintaining the withstand voltage by using the super junction structure.

Also, in the insulated gate bipolar transistor of this preferred embodiment, the injection of holes from the collector electrode 13 is facilitated and snap-back voltage can be made small by determining the width of the P collector layer 12 such that a voltage drop of 0.5 V or more occurs in the N buffer layer 11 between a middle point of the P collector layer 12 and the N collector layer 15.

Also, in the insulated gate bipolar transistor of this preferred embodiment, the injection of holes from the collector electrode 13 is facilitated and snap-back voltage can be made small by setting the repetition pitch of the N collector layer 15 and the P collector layer 12 at 5 to 15000 times the repetition pitch of the first drift layers 1 and 2.

In a method of manufacturing the insulated gate bipolar transistor of this preferred embodiment, the process of forming the first drift layers 1 and 2 includes (a) an implantation step, (b) a diffusion step, and (c) an epitaxial growth step, and an insulated gate bipolar transistor with small on-state voltage can be manufactured while maintaining the withstand voltage.

It is not essential to form the super junction structure of the first drift layer directly on the N buffer layer 11, and the effects of the present invention are obtained also when an N-drift layer is provided as a third drift layer between the super junction structure of the first drift layer and the N buffer layer 11.

Fourth Preferred Embodiment

Figure 15:
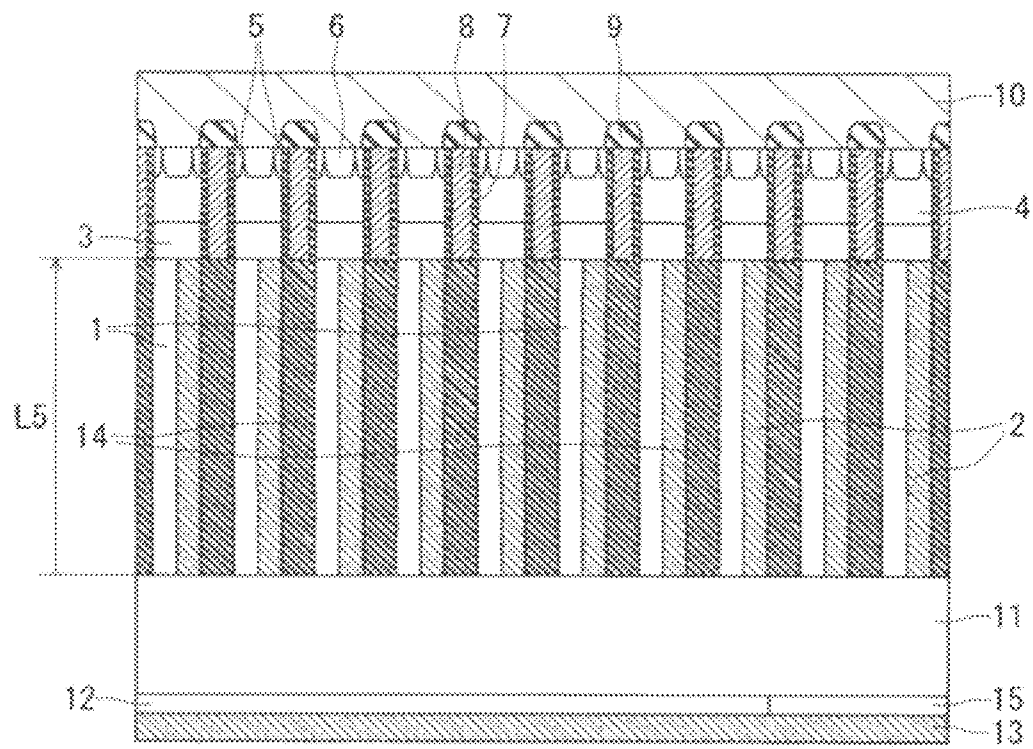
FIG. 15 is a cross-sectional view illustrating the structure of an RC-IGBT according to a fourth preferred embodiment.

FIG. 15 is a cross-sectional view illustrating the structure of an RC-IGBT as an insulated gate bipolar transistor according to a fourth preferred embodiment of the present invention. This differs from the RC-IGBT of the third preferred embodiment in that the first drift layer has a super junction structure in which N-drift layers 1, insulating layers 14 such as $SiO_2$, and P-drift layers 2 are repeated in the horizontal direction in the diagram, which is formed by a trench step, an implantation step, and a diffusion step. The thicknesses of the N-drift layers 1, insulating layers 14, and P-drift layers 2 are all L5.

In the super junction structure, the N-drift layers 1, P-drift layers 2, and insulating layers 14 may be regularly repeated in this order in the horizontal direction, or insulating layers 14 may be inserted in arbitrary positions between the N-drift layers 1 and the P-drift layers 2.

In other respects, the structure is the same as that of the third preferred embodiment, and the same description thereof is not repeated here.

Operation

Basic operation is the same as that of the third preferred embodiment.

When a positive voltage is applied to the gate electrodes 8, the region of the P base layer 4 between the N emitter layers 5 and the N-drift layer 3 is inverted to N type, and electrons are injected from the N emitter layers 5 into the N-drift layer 3, and this RC-IGBT conducts forward. With a gate voltage of or higher than the threshold Vth being applied to the gate electrodes 8, when a collector voltage high enough to forward bias the PN junction between the P collector layer 12 and the N buffer layer 11 is applied to the collector electrode 13, holes are injected from the collector electrode 13 into the N-drift layer 1 through the P collector layer 12, and conductivity modulation occurs, and the resistance value of the first and second drift layers rapidly falls and it has sufficient current conducting ability.

When a negative bias is applied to the gate electrodes 8 and a certain voltage is applied to the emitter electrode 10 and the collector electrode 13 (emitter voltage<collector voltage), a depletion layer extends from the P base layer 4 toward the N-drift layer 3 and the repetition structure of the N-drift layers 1, insulating layers 14, and the P-drift layers 2. When the amounts of carriers contained in the N-drift layer 1 and the P-drift layer 2 are adjusted the same, the N-drift layers 1 are completely depleted, and a high electric field can be held.

FIG. 16B shows a simulation of the electric field strength distribution in the depletion layer occurring when a voltage of 600 V is applied between the emitter and collector when the RC-IGBT of this preferred embodiment is off. FIG. 16A shows a cross section of the same IGBT as that of FIG. 15. The solid line of FIG. 16B shows the electric field strength distribution along line A-A' passing through the N-drift layer 1, and the broken line of FIG. 16B shows the electric field strength distribution along line B-B' passing through the P-drift layer 2. According to the results of simulation, the electric field strength distributions in the depletion layer are almost trapezoidal.

Next, FIG. 17 shows a simulation about the collector voltage-collector current density characteristic, wherein, in the RC-IGBT of this preferred embodiment, the thicknesses L5 of the N-drift layers 1, P-drift layers 2 and the insulating layers 14 are set at 40 μm. For comparison, the value of the RC-IGBT having the conventional structure of FIG. 19 is also shown, wherein the thickness of the N-drift layer 1 is set at 90 μm.

From FIG. 17, while, with the conventional structure, the on-state voltage at which the collector current density is about 100 A/cm$^2$ is about 1.4 V, the on-state voltage of the super junction structure of this preferred embodiment is somewhat larger at about 1.5 V. However, in the lower current density region wherein the current density is 20 A/cm$^2$ or lower, MOSFET characteristic (uni-polar characteristic) with smaller on-state resistance is obtained, and it is seen that the on-state voltage at low current densities is small.

The N type impurity concentration can be set at a large value by adjusting the same the N type impurity concentration of the N-drift layers 1, 3 and the N buffer layer 11. Also, the repetition pitch of the P collector layer 12 and the N collector layer 15 is set at 5 to 15000 times the cell pitch and the width of the P collector layer 12 (in the horizontal direction in FIG. 15) is set large, whereby the injection of holes from the collector electrode 13 is facilitated. Accordingly, the MOSFET characteristic offers small snap-back voltage and small on-state resistance, the MOSFET operating current density can be about 1/10 to 1/5 of the rating current density, and the MOSFET operating range can be set large.

In this way, according to the RC-IGBT of this preferred embodiment, by properly selecting the impurity concentrations of the N-drift layers 1 and the P-drift layers 2 and the film thickness L5 of the super junction layer, it is possible to make the on-state voltage small while maintaining the withstand voltage, and to obtain a MOSFET characteristic with small on-state resistance with a current density not more than about 1/10 to 1/5 of the rating current density.

The description above has illustrated the conductivity types of individual layers defined as N type and P type, but the same effects are obtained when these conductivity types are all inverted.

Effects

The insulated gate bipolar transistor of this preferred embodiment further includes a collector layer (N collector layer 15) of a first conductivity type formed on a second main surface of the N buffer layer 11, and that collector layer forms a repetition structure with the collector layer (P collector layer 12) of a second conductivity type in the horizontal direction, and the collector electrode 13 is formed on the P collector layer 12 and the N collector layer 15. Thus, also in such an RC-IGBT, it is possible to make the on state-voltage small while maintaining the withstand voltage by using the super junction structure.

Also, in the insulated gate bipolar transistor of this preferred embodiment, the injection of holes from the collector electrode 13 is facilitated and snap-back voltage can be made small by setting the repetition pitch of the N collector layer 15 and the P collector layer 12 at 5 to 15000 times the repetition pitch of the first drift layers 1, 2 and 14.

In a method of manufacturing the insulated gate bipolar transistor of this preferred embodiment, the process of forming the first drift layers 1, 2 and 14 includes (d) a trench step, (e) an implantation step, and (f) a diffusion step, and an insulated gate bipolar transistor with small on-state voltage can be manufactured while maintaining the withstand voltage.

It is not essential to form the super junction structure of the first drift layer directly on the N buffer layer 11, and the effects of the present invention are obtained also when an N-drift layer is provided as a third drift layer between the super junction structure of the first drift layer and the N buffer layer 11.

While the invention has been described in detail, the foregoing description is in all aspects illustrative and not restrictive. It is understood that numerous other modifications and variations can be devised without departing from the scope of the invention.

What is claimed is:

1. An insulated gate bipolar transistor comprising:

a buffer layer of a first conductivity type;

a first drift layer formed on a first main surface of said buffer layer;

a second drift layer of the first conductivity type formed on said first drift layer;

a base layer of a second conductivity type formed on said second drift layer;

an emitter layer of the first conductivity type selectively formed in a surface of said base layer;

a gate electrode buried from a surface of said emitter layer through into said second drift layer with a gate insulating film therebetween;

an emitter electrode conducting to said emitter layer;

a collector layer of the second conductivity type formed on a second main surface of said buffer layer; and a collector electrode formed on said collector layer, said first drift layer having a structure in which a first layer of the first conductivity type and a second layer of the second conductivity type are repeated in a horizontal direction.

2. The insulated gate bipolar transistor according to claim 1, wherein an insulating film is arbitrarily formed between said first layers and said second layers.

3. A method of manufacturing the insulated gate bipolar transistor according to claim 2, which includes:

(d) a trench step;

(e) an implantation step; and (f) a diffusion step, as a process for forming said first drift layer.

4. The insulated gate bipolar transistor according to claim 1, wherein said first drift layer is formed of a wide band-gap semiconductor.

5. The insulated gate bipolar transistor according to 1, further comprising a collector layer of the first conductivity type formed on the second main surface of said buffer layer, said collector layer of the first conductivity type forming a repetition structure with said collector layer of the second conductivity type in the horizontal direction, wherein said collector electrode is formed on said collector layer of the second conductivity type and said collector layer of the first conductivity type.

6. The insulated gate bipolar transistor according to claim 5, wherein a width of said collector layer of the second conductivity type is determined such that a voltage drop of 0.5 V or more occurs in said buffer layer between a middle point of said collector layer of the second conductivity type and said collector layer of the first conductivity type.

7. The insulated gate bipolar transistor according to claim 6, wherein a repetition pitch of said collector layer of the first conductivity type and said collector layer of the second conductivity type is 5 to 15000 times a repetition pitch of said first drift layer.

8. A method of manufacturing the insulated gate bipolar transistor according to claim 1, which includes:

(a) an implantation step;

(b) a diffusion step; and (c) an epitaxial growth step, as a process for forming said first drift layer.

9. An insulated gate bipolar transistor comprising:

a buffer layer of a first conductivity type;

a first drift layer formed on a first main surface of said buffer layer;

a second drift layer of the first conductivity type formed on said first drift layer;

a base layer of a second conductivity type formed on said second drift layer;

an emitter layer of the first conductivity type selectively formed in a surface of said base layer;

a gate electrode buried from a surface of said emitter layer through into said second drift layer with a gate insulating film therebetween;

an emitter electrode conducting to said emitter layer;

a collector layer of the second conductivity type formed on a second main surface of said buffer layer; and a collector electrode formed on said collector layer, said first drift layer having a structure in which a first layer of the first conductivity type, an insulating layer, and a second layer of the second conductivity type are repeated in this order in a horizontal direction.

10. The insulated gate bipolar transistor according to claim 9, wherein said first drift layer is formed of a wide band-gap semiconductor.

11. The insulated gate bipolar transistor according to claim 9, further comprising a collector layer of the first conductivity type formed on the second main surface of said buffer layer, said collector layer of the first conductivity type forming a repetition structure with said collector layer of the second conductivity type in the horizontal direction, wherein said collector electrode is formed on said collector layer of the second conductivity type and said collector layer of the first conductivity type.

12. The insulated gate bipolar transistor according to claim 11, wherein a width of said collector layer of the second conductivity type is determined such that a voltage drop of 0.5 V or more occurs in said buffer layer between a middle point of said collector layer of the second conductivity type and said collector layer of the first conductivity type.

13. The insulated gate bipolar transistor according to claim 12, wherein a repetition pitch of said collector layer of the first conductivity type and said collector layer of the second conductivity type is 5 to 15000 times a repetition pitch of said first drift layer.

14. A method of manufacturing the insulated gate bipolar transistor according to claim 9, which includes:

(d) a trench step;

(e) an implantation step; and (f) a diffusion step, as a process for forming said first drift layer.

15. An insulated gate bipolar transistor comprising:

a buffer layer of a first conductivity type;

a third drift layer of the first conductivity type formed on a first main surface of said buffer layer;

a first drift layer formed on said third drift layer;

a second drift layer of the first conductivity type formed on said first drift layer;

a base layer of a second conductivity type formed on said second drift layer;

an emitter layer of the first conductivity type selectively formed in a surface of said base layer;

a gate electrode buried from a surface of said emitter layer through into said second drift layer with a gate insulating film therebetween;

an emitter electrode conducting to said emitter layer;

a collector layer of the second conductivity type formed on a second main surface of said buffer layer; and a collector electrode formed on said collector layer, said first drift layer having a structure in which a first layer of the first conductivity type and a second layer of the second conductivity type are repeated in a horizontal direction.

16. The insulated gate bipolar transistor according to claim 15, wherein an insulating film is arbitrarily formed between said first layers and said second layers.

17. A method of manufacturing the insulated gate bipolar transistor according to claim 16, which includes:

(d) a trench step;

(e) an implantation step; and (f) a diffusion step, as a process for forming said first drift layer.

18. The insulated gate bipolar transistor according to claim 15, further comprising a collector layer of the first conductivity type formed on the second main surface of said buffer layer, said collector layer of the first conductivity type forming a repetition structure with said collector layer of the second conductivity type in the horizontal direction, wherein said collector electrode is formed on said collector layer of the second conductivity type and said collector layer of the first conductivity type.

19. The insulated gate bipolar transistor according to claim 18, wherein a width of said collector layer of the second conductivity type is determined such that a voltage drop of 0.5 V or more occurs in said buffer layer between a middle point of said collector layer of the second conductivity type and said collector layer of the first conductivity type.

20. The insulated gate bipolar transistor according to claim 19, wherein a repetition pitch of said collector layer of the first conductivity type and said collector layer of the second conductivity type is 5 to 15000 times a repetition pitch of said first drift layer.

21. A method of manufacturing the insulated gate bipolar transistor according to claim 15, which includes:

(a) an implantation step;

(b) a diffusion step; and (c) an epitaxial growth step, as a process for forming said first drift layer.

22. An insulated gate bipolar transistor comprising:

a buffer layer of a first conductivity type;

a third drift layer of the first conductivity type formed on a first main surface of said buffer layer;

a first drift layer formed on said third drift layer;

a second drift layer of the first conductivity type formed on said first drift layer;

a base layer of a second conductivity type formed on said second drift layer;

an emitter layer of the first conductivity type selectively formed in a surface of said base layer;

a gate electrode buried from a surface of said emitter layer through into said second drift layer with a gate insulating film therebetween;

an emitter electrode conducting to said emitter layer;

a collector layer of the second conductivity type formed on a second main surface of said buffer layer; and a collector electrode formed on said collector layer, said first drift layer having a structure in which a first layer of the first conductivity type, an insulating layer, and a second layer of the second conductivity type are repeated in this order in a horizontal direction.

23. The insulated gate bipolar transistor according to claim 22, further comprising a collector layer of the first conductivity type formed on the second main surface of said buffer layer, said collector layer of the first conductivity type forming a repetition structure with said collector layer of the second conductivity type in the horizontal direction, wherein said collector electrode is formed on said collector layer of the second conductivity type and said collector layer of the first conductivity type.

24. The insulated gate bipolar transistor according to claim 23, wherein a width of said collector layer of the second conductivity type is determined such that a voltage drop of 0.5 V or more occurs in said buffer layer between a middle point of said collector layer of the second conductivity type and said collector layer of the first conductivity type.

25. The insulated gate bipolar transistor according to claim 24, wherein a repetition pitch of said collector layer of the first conductivity type and said collector layer of the second conductivity type is 5 to 15000 times a repetition pitch of said first drift layer.

26. A method of manufacturing the insulated gate bipolar transistor according to claim 22, which includes:

(d) a trench step;

(e) an implantation step; and (f) a diffusion step, as a process for forming said first drift layer.

* * * * *